United States Patent
Myokan et al.

(10) Patent No.: US 10,438,365 B2
(45) Date of Patent: Oct. 8, 2019

(54) IMAGING DEVICE, SUBJECT INFORMATION ACQUISITION METHOD, AND COMPUTER PROGRAM

(71) Applicant: SONY INTERACTIVE ENTERTAINMENT INC., Tokyo (JP)

(72) Inventors: Yoshihiro Myokan, Tokyo (JP); Akio Ohba, Tokyo (JP); Hidehiko Ogasawara, Tokyo (JP); Shinya Wada, Tokyo (JP); Akihiko Sugawara, Tokyo (JP); Hiroyuki Segawa, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 82 days.

(21) Appl. No.: 15/698,813

(22) Filed: Sep. 8, 2017

(65) Prior Publication Data

US 2018/0075615 A1 Mar. 15, 2018

(30) Foreign Application Priority Data

Sep. 12, 2016 (JP) ................... 2016-177965

(51) Int. Cl.
| | | |
|---|---|---|
| *G06T 7/00* | (2017.01) | |
| *G06T 7/557* | (2017.01) | |
| *G06T 7/80* | (2017.01) | |
| *G02B 27/28* | (2006.01) | |
| *G06T 7/60* | (2017.01) | |

(Continued)

(52) U.S. Cl.
CPC ............ *G06T 7/557* (2017.01); *G02B 27/288* (2013.01); *G06T 7/55* (2017.01); *G06T 7/60* (2013.01); *G06T 7/80* (2017.01); *H04N 5/2254* (2013.01); *H04N 5/3696* (2013.01); *H04N 9/045* (2013.01);

(Continued)

(58) Field of Classification Search
CPC .. G06T 7/80; G06T 7/557; G06T 7/60; G06T 7/55; G02B 27/288; H01L 27/14625; H01L 27/14621; H04N 5/3696; H04N 5/2254; H04N 9/045
See application file for complete search history.

(56) References Cited

U.S. PATENT DOCUMENTS 9,086,620 B2 7/2015 Hiramoto
9,571,819 B1 * 2/2017 Barron ................. H04N 13/128
(Continued)

FOREIGN PATENT DOCUMENTS

JP 2009-058533 A 3/2009
JP 2012015766 A 1/2012
(Continued)

OTHER PUBLICATIONS

Notification of Reason for Refusal for correspodnign JP Application No. 2016-177965, 7 pages, dated Jul. 3, 2018.

*Primary Examiner* — Zhihan Zhou
(74) *Attorney, Agent, or Firm* — Matthew B. Dernier

(57) ABSTRACT

An imaging device includes a filter, imaging elements, and an image processing section. The filter has a plurality of regions transmitting different light components. The imaging elements detect a luminance distribution of polarization components in a plurality of directions of light transmitted by the filter. The image processing section analyzes the detected luminance distribution based on correlation between the components, thereby generating a plurality of items of information about a subject.

8 Claims, 5 Drawing Sheets

(51) Int. Cl.
  *H04N 5/369*   (2011.01)
  *H04N 5/225*   (2006.01)
  *H04N 9/04*    (2006.01)
  *G06T 7/55*    (2017.01)
  *H01L 27/146*  (2006.01)

(52) U.S. Cl.
  CPC .. *H01L 27/14621* (2013.01); *H01L 27/14625* (2013.01)

(56) References Cited

U.S. PATENT DOCUMENTS

| | | | |
|---|---|---|---|
| 2009/0135183 A1* | 5/2009 | Sato | G01B 11/002 |
| | | | 345/426 |
| 2009/0290039 A1* | 11/2009 | Kanamori | H04N 9/045 |
| | | | 348/222.1 |
| 2012/0182395 A1* | 7/2012 | Hiramoto | G03B 35/08 |
| | | | 348/46 |
| 2015/0138527 A1* | 5/2015 | Hiramto | G03B 35/08 |
| | | | 356/4.01 |
| 2017/0366802 A1 | 12/2017 | Hirasawa | |
| 2018/0006066 A1* | 1/2018 | Okuno | H01L 27/14 |

FOREIGN PATENT DOCUMENTS

| | | |
|---|---|---|
| JP | 2012-080065 A | 4/2012 |
| JP | 2014-057231 A | 3/2014 |
| WO | 2008/149489 A1 | 12/2008 |
| WO | 2016136086 A1 | 1/2016 |

* cited by examiner

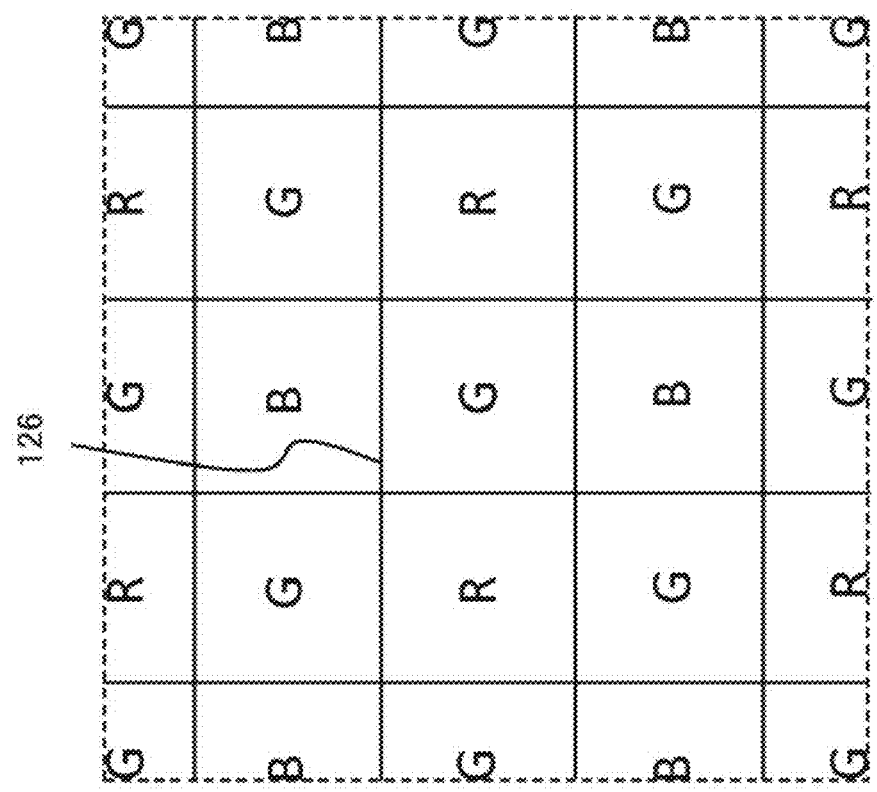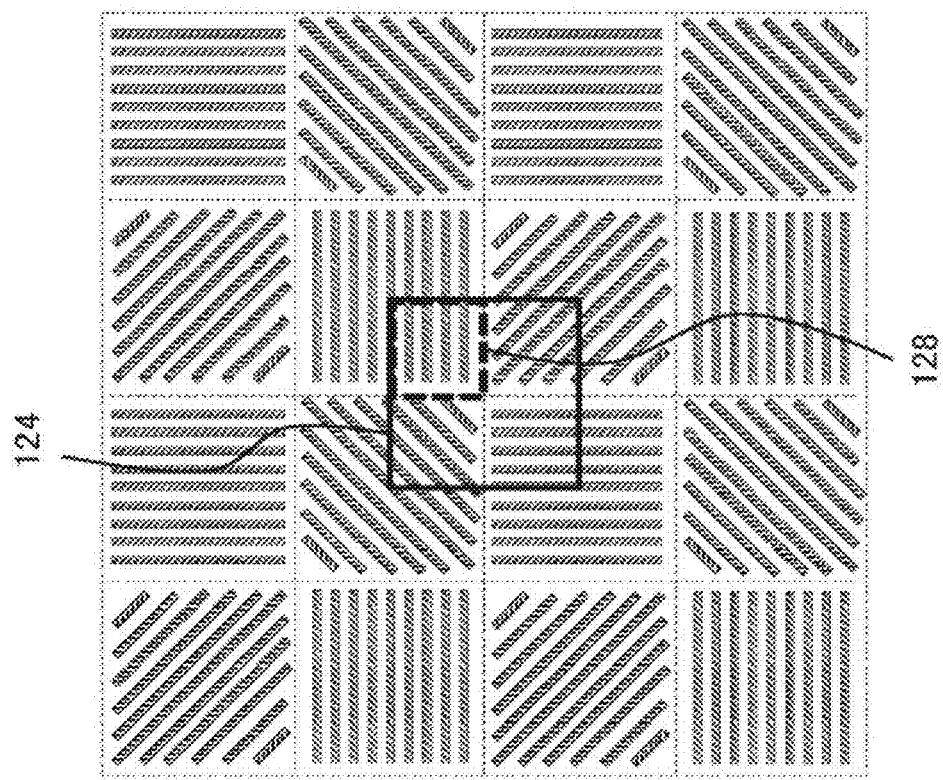

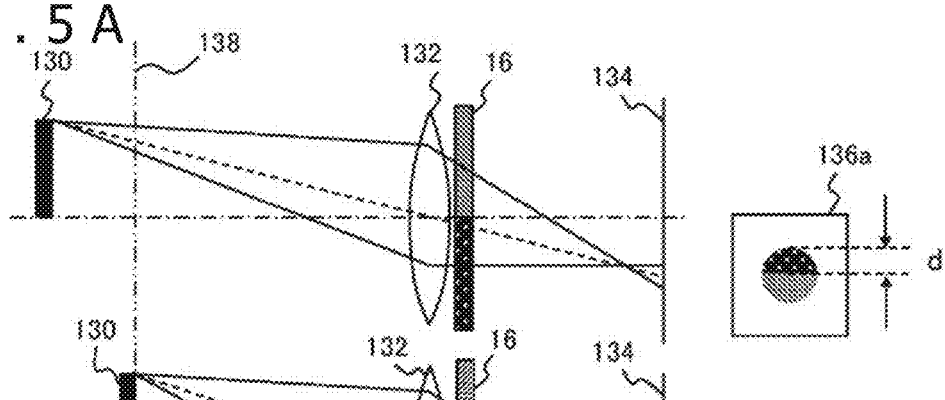
FIG.5A
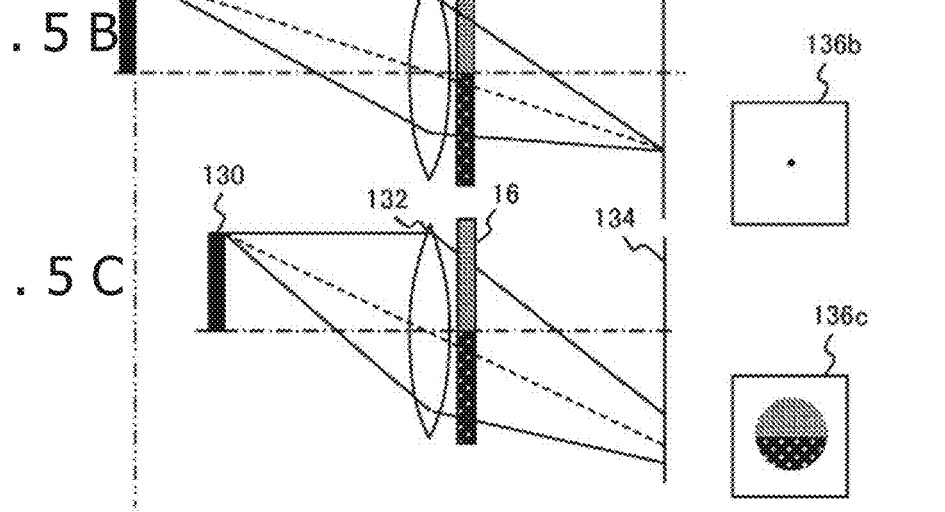

IMAGING DEVICE, SUBJECT INFORMATION ACQUISITION METHOD, AND COMPUTER PROGRAM

BACKGROUND OF THE INVENTION

1. Field of the Invention

The present disclosure relates to techniques for acquiring information about the state of a subject space to be imaged.

2. Description of the Related Art

There exist commercially available polarization cameras that acquire polarization information about a subject using a polarization filter mounted on sensors. The polarization camera may be used to acquire plane direction information about the subject as well as the presence of a transparent object. This makes it easy to identify objects and detect extraneous materials. For that reason, the polarization cameras are expected to find their way into a wide range of applications including inspection devices on manufacturing lines and car-mounted cameras (e.g., see Japanese Patent Laid-Open Nos. 2012-80065 and 2014-57231).

Polarization cameras operate on the principle of sifting through light components in a manner detecting the light transmitted by a polarization filter having polarizing axes oriented in predetermined directions. Because of their operating principle, the polarization cameras are limited in terms of the information they can acquire, which limits the range of applications they can be used in. On the other hand, the information acquired by polarization cameras such as plane directions is useful in diverse kinds of information processing for image analysis. Thus there is a demand for techniques enabling polarization cameras to be used with ease in that kind of processing.

SUMMARY OF THE INVENTION

The present disclosure has been made in view of the above circumstances. It is desirable to provide techniques for easily acquiring diverse information about the subject to be imaged using polarization information.

According to an embodiment, of the present disclosure, there is provided an imaging device including a filter configured to have multiple regions transmitting different light components, imaging elements configured to detect a luminance distribution of polarization components in multiple directions of light transmitted by the filter, and an image processing section configured to analyze the detected luminance distribution based on correlation between the components, thereby generating multiple items of information about a subject.

According to another embodiment of the present disclosure, there is provided a subject information acquisition method including acquiring a luminance distribution of polarization components in multiple directions of light transmitted by a filter having multiple regions transmitting different light components, and analyzing the acquired luminance distribution based on correlation between the components to generate multiple items of information about a subject, before storing the information into a memory.

According to further another embodiment of the present disclosure, there is provided a computer program for a computer. The computer program, includes by imaging elements, acquiring a luminance distribution of polarization components in a plurality of directions of light transmitted by a filter having a plurality of regions transmitting different light components, and by an image processing section, analyzing the acquired luminance distribution based on correlation between the components to generate a plurality of items of information about a subject and to output the information.

Where other combinations of the above-outlined composing elements or the above expressions of the present disclosure are converted between different forms such as a method and a device, they still constitute effective embodiments of the present disclosure.

According to the present disclosure, it is easy to acquire diverse information about the subject to be imaged using polarization information.

BRIEF DESCRIPTION OF THE DRAWINGS

FIGS. 3A and 3B are schematic views showing polarizers with different principal axis angles in a polarizer layer of the embodiment, and a typical layout of color filters in a color filter layer of the embodiment;

FIGS. 5A, 5B, and 5C are schematic views explanatory of the principle of acquiring distance information using a component isolation filter of the embodiment;

DETAILED DESCRIPTION OF THE PREFERRED EMBODIMENT

Figure 1:
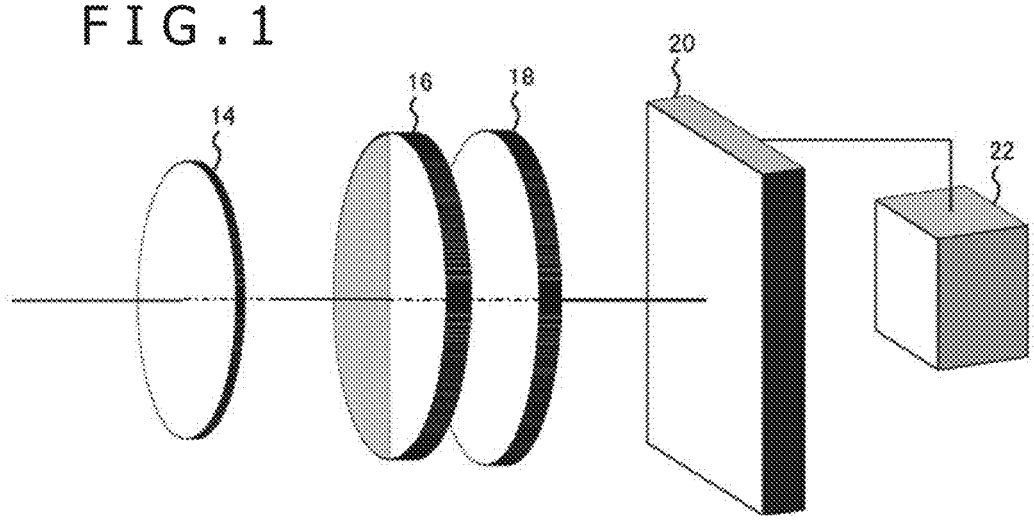
FIG. 1 is a conceptual view showing a configuration of an imaging device embodying the present disclosure.

FIG. 1 is a conceptual view showing a configuration of an imaging device 12 embodying the present disclosure. The imaging device 12 includes an imaging optics 14, a component isolation filter 16, a diaphragm 18, an imaging element array 20, and an image processing section 22. The imaging optics 14 has an ordinary configuration that includes focusing lenses for forming a subject image on an imaging plane of the imaging element array 20. In FIG. 1, the focusing lenses are represented by a single lens. The component isolation filter 16 with its different regions transmits different components of light. This makes it possible to isolate the paths of light from the subject based on the distribution of the components detected by the imaging element array 20. Information about the light paths is used to acquire the distance to the subject.

The diaphragm 18 has an ordinary structure that includes an opening whose diameter is changed to adjust the amount of incident light. The imaging element array 20 includes a two-dimensional array of imaging elements that convert the intensity of detected light into electrical charges for output to the image processing section 22. The imaging elements of the present embodiment are configured at least to detect polarization components in multiple directions. The imaging elements are further configured to detect different light components isolated by the component isolation filter 16 with its different transmission regions. For example, if the component isolation filter 16 is made up of a color filter with its different regions transmitting different colors of light, the imaging elements are configured to detect these colors distinct from each other. On the other hand, if the component isolation filter 16 is composed of polarizers in different regions transmitting polarization components in different directions, it is possible to commonly utilize the above-mentioned configuration for detecting polarization components in multiple directions.

The image processing section 22 performs image processing using a two-dimensional luminance distribution of the light components detected by the imaging element array 20. In so doing, the image processing section 22 generates a luminance image for each light component, and analyzes the luminance images to generate information about the distance to the subject and about normal lines on the subject surface. Typically generated as the distance information is a depth image with its pixel values representing the distance from the imaging device 12 to the subject. As the normal line information, a normal line image is typically generated with its pixel values constituting a parameter representing the direction of normal lines on the subject surface.

The imaging device 12 may further include an operation section to be operated by a user and a mechanism for executing imaging operations or imaging condition adjusting operations depending on what kind of operation is performed by the user. The imaging device 12 may also include a mechanism for establishing wired or wireless communication with an external device such as a game machine or a personal computer in order to send generated data thereto or to receive control signals such as a data transmission request therefrom. These mechanisms are substantially the same as those of ordinary imaging devices and thus will not be discussed further.

Figure 2:
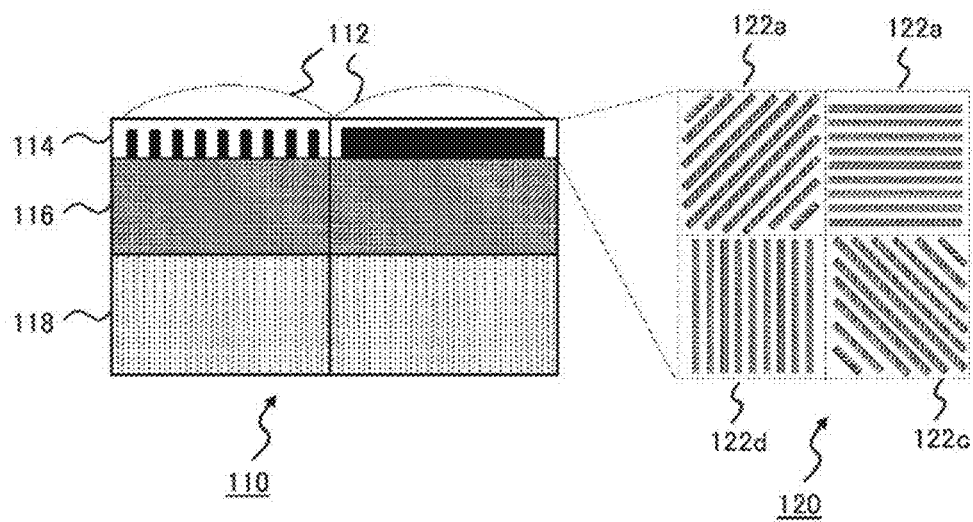
FIG. 2 is a schematic view showing a typical configuration of an imaging element included in the imaging device of the embodiment.

FIG. 2 schematically shows a typical configuration of an imaging element included in the imaging device 12. FIG. 2 illustrates schematically a functional structure of a cross-section of the element and excludes details such as interlayer insulating films and wiring. An imaging element 110 includes a micro lens layer 112, a polarizer layer 114, a color filter layer 116, and a light detection layer 118. The polarizer layer 114 includes polarizers having multiple linear conductor members arranged in stripes at intervals shorter than the wavelength of incident light. When the light focused by the micro lens layer 112 is incident on the polarizer layer 114, the polarizer layer 114 reflects polarization components in parallel with its polarizer lines and transmits only the polarization component perpendicular to the lines.

Polarized luminance is acquired by the light detection layer 118 detecting the transmitted polarization components. The light detection layer 118 has an ordinary semiconductor device structure such as that of charge-coupled device (CCD) image sensors or of complementary metal oxide semiconductor (CMOS) image sensors. The polarizer layer 114 includes arrays of polarizers with different principal axis angles arranged in increments at least the size of a charge-reading unit of the light detection layer 118, i.e., at least in units of pixels. The right-hand subfigure in FIG. 2 illustrates a polarizer array 120 with the polarizer layer 114 viewed from above.

In this subfigure, hatched lines denote conductors (wires) that constitute the polarizers. Each rectangle formed by dotted lines represents a region of polarizers with a given principal axis angle. The dotted lines are for illustration purposes and not actually formed. In this example, the polarizers with four different principal axis angles are arranged in four regions 122a, 122b, 122c, and 122d, in two rows and two columns. In the subfigure, the polarizer regions positioned diagonally to each other have their principal axis angles set perpendicular to each other. The polarizer regions positioned adjacent to each other have an angular difference of 45 degrees therebetween. That is, the polarizers have four principal axis angles 45 degrees apart.

Each polarizer transmits the polarization component in a direction perpendicular to the direction of the wire. Thus in the light detection layer 118 located below, the regions corresponding to the four regions 122a, 122b, 122c, and 122d acquire the luminance of the polarization components in four directions 45 degrees apart. A predetermined number of such polarizer arrays with four different principal axis angles are arranged in longitudinal and crosswise directions and connected with a peripheral circuit that controls the timing of electric charge reading. This arrangement implements image sensors that acquire four kinds of polarized luminance as a two-dimensional distribution.

The imaging element 110 shown in FIG. 2 has the color filter layer 116 interposed between the polarizer layer 114 and the light detection layer 118. The color filter layer 116 includes arrays of filters that transmit red, green, and blue light. The polarizers with their different principal axis angles in the polarizer layer 114 located above are combined with the different filter colors of the color film layer 116 located below to provide the polarized luminance of each different color.

That is, the luminance of light of the same color polarized in the same direction is acquired discretely on an image plane. Suitably interpolating the light of different colors polarized in different directions provides a polarized image for each different combination of the direction and color. It is possible to generate normal line information by acquiring polarization properties using the polarized luminance of the same color in four directions. It is also possible to generate an unpolarized color image having an average of polarized luminance values in the four directions at a given position as the luminance of the color at that position, and to generate distance information using the unpolarized color image thus generated.

Image acquisition techniques using wire grid polarizers such as those shown in FIG. 2 are disclosed in Japanese Patent Laid-Open No. 2012/80065, and techniques for acquiring polarized color images are disclosed in PCT Patent Publication No. WO2008/149489, for example. It is to be noted that the device structure of the imaging device 12 of the present embodiment is not limited to what is illustrated in the drawing. For example, the polarizers are not limited to those of the wire grid type and may be of any commercialized types including linear dichroic polarizers.

If the component isolation filter 16 is not formed by color filters and if color images are not used in other applications such as the display of images, then the color filter layer 116 may be omitted. Although the ensuing description will focus on an embodiment that includes the color filter layer 116, it will be appreciated by those skilled in the art that where the color filter layer 116 is excluded, similar advantages are still obtained with only parts of the configuration and the processing omitted.

FIGS. 3A and 3B schematically show polarizers with different principal axis angles in the polarizer layer 114, and a typical layout of filters of different colors in the color filter layer 116. FIG. 3A shows an array of polarizers with a portion of the polarizer layer 114 viewed from above, the array being illustrated in the same manner as the polarizer array 120 in FIG. 2. FIG. 3B shows an array of color filters corresponding to the portion indicated in FIG. 3A. In FIG.

3B, reference character R stands for a filter that transmits red light, G for a filter that transmits green light, and B for a filter that transmits blue light.

In this example, the regions of polarizers with different principal axis angles and the regions of filters of different colors are each shown as a square of the same size. The regions are arranged in such a manner that a vertex of one region is located at the center of another region. For example, below a region 124 indicated by thick lines in FIG. 3A, a "G" region 126 in FIG. 3B is disposed. The color filter layer 116 is assumed to have an ordinary Bayer array. With this array, the light transmitted by the polarizers with four principal axis angles constitutes the polarization components in four directions which in turn are transmitted by the same filter of the color filter layer 116. The light thus transmitted is detected as polarized color light.

The polarizer layer 114 and the color filter layer 116 are arranged in repeated arrays as shown in FIGS. 3A and 3B. The unit of charge reading in the light detection layer 118 is arranged to correspond to each region (e.g., region 128) formed by bisecting each polarizer region in longitudinal and crosswise directions. This provides the luminance values of 12 polarization components for each color and for each direction. The 12 kinds of luminance data can also be acquired using arrays other than those illustrated. For example, with the vertexes of each region of polarizers arranged to coincide with the vertexes of each region of filters, the 12 kinds of luminance data are still obtained by devising a suitable order in which the regions are arranged so that their combinations are varied. Alternatively, the regions may be varied in size, with each region of polarizers or each region of color filters arranged to correspond to the other regions formed in two rows and two columns, for example.

Still, if the regions are arranged as illustrated, the polarizers with one principal axis angle need be formed with regard to four pixel regions in two rows and two columns. This makes it easier to manufacture the polarizers than if they are to be formed in one-to-one correspondence with the pixels. This arrangement also reduces the possibility of a polarization component in a different direction leaking to an adjacent pixel. Furthermore, the polarization components of the same color in four directions or of three colors in the same direction are detected at positions close to each other. That means few errors are incurred in subsequent interpolation and analysis processing. When the luminance values of the polarization components in four directions at the same position (i.e., pixel) and the luminance values of unpolarized light of three colors are accurately obtained as described above, it is easy to determine positional correspondence between normal line information and distance information using the luminance measurements.

Figure 4:
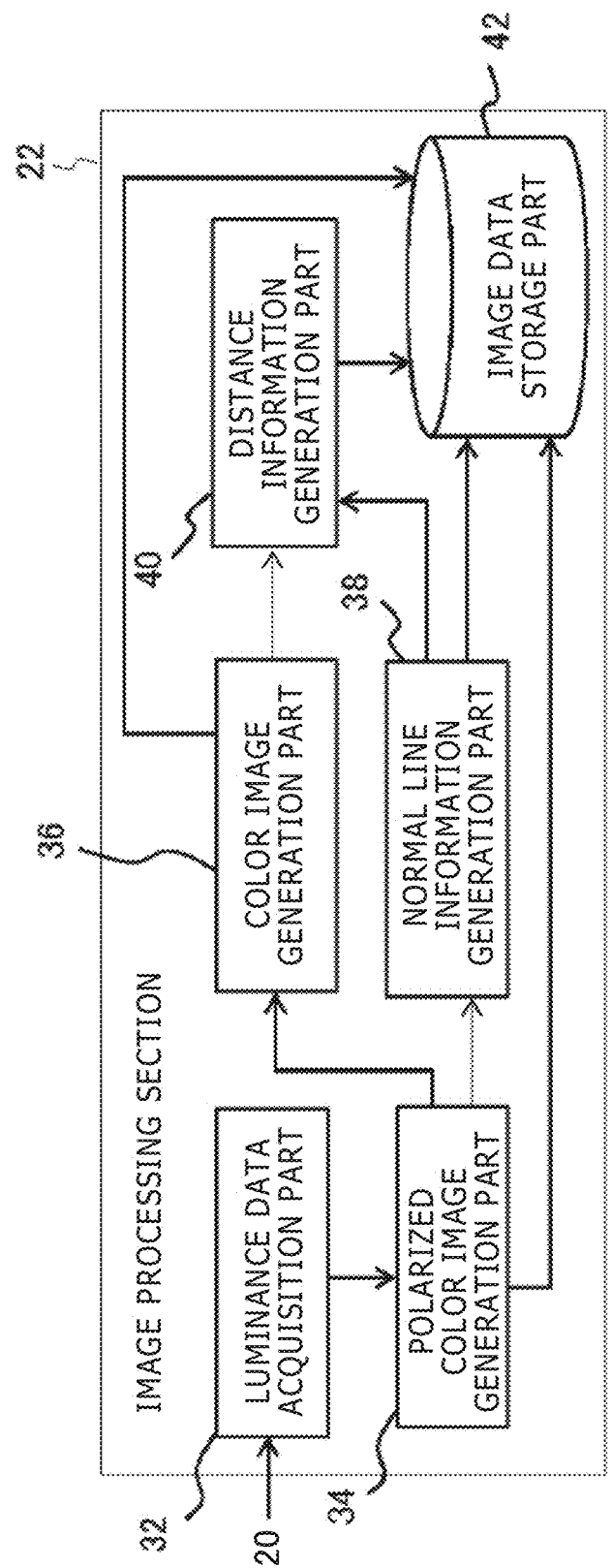
FIG. 4 is a functional block diagram of an image processing section of the embodiment.

FIG. 4 shows functional blocks of the image processing section 22 of the present embodiment. The functional blocks shown in FIG. 4 are implemented by hardware using a configuration including imaging elements, arithmetic circuits, a microprocessor, and a buffer memory, or by software using programs stored in a memory. It will be appreciated by those skilled in the art that these functional blocks are implement diversely by hardware only, by software only, or by their suitable combinations and are not limited to any specific implementation.

The image processing section 22 includes a luminance data acquisition part 32, a polarized color image generation part 34, a color image generation part 36, a normal line information generation part 38, a distance information generation part 40, and an image data storage part 42. The luminance data acquisition part 32 acquires two-dimensional luminance data from the imaging element array 20, The polarized color image generation part 34 generates a polarized color image by interpolating the two-dimensional luminance data for each component. The color image generation part 36 generates an unpolarized color image by averaging the polarization components in four directions. The normal line information generation part 38 generates normal line information about a subject using the polarization components in four directions. The distance information generation part 40 generates distance information using color images and normal line information. The image data storage part 42 stores generated data.

The luminance data acquisition part 32 acquires two-dimensional distribution data of the luminance detected by the imaging element array 20. As shown in FIG. 2, the imaging elements that include the polarizer layer 114 made of polarizers with four principal axis angles and the color filter layer 116 formed by red, green, and blue filters provide two-dimensional data discretely indicating the luminance values of 12 kinds of light derived from the combinations of colors and polarization component directions.

The polarized color image generation part 34 generates a polarized color image for each color and for each direction by extracting and interpolating the discretely obtained two-dimensional distribution of the luminance for each kind of light. An ordinary demosaicing process may be adopted for the interpolation processing. However, as shown in FIGS. 2, 3A, and 3B, in the case of the imaging elements that also isolate the polarization components, the spacing between the pixels having the same color and the polarization component in the same direction is greater than the spacing between the pixels having the same color in an ordinary Bayer array raw image. This suppresses the high-frequency component in the interpolated image, presumably affecting subsequent processes such as edge extraction and feature point detection.

For that reason, the polarized color image generation part 34 may first interpolate the polarization data about green with the smallest spacing between the pixels to obtain the high-frequency component to be added to the polarization data about red and blue, thereby reconstituting details in the polarized image in each color and each direction. Alternatively, the polarized color image generation part 34 may average the polarized images of green interpolated in four directions at the same position to generate an unpolarized luminance image of green, before adding the high-frequency component of the image to the polarized image of each color. In any case, the polarized color image generation part 34 generates 12 polarized color images representative of the luminance of the polarization components in four directions in terms of pixel values for each of red, green, and blue.

The color image generation part 36 generates an unpolarized color image (luminance image) by averaging the polarized color images of each color in four directions at the same position. When the polarized color image generation part 34 generates an unpolarized luminance image of green for high-frequency component extraction, the data obtained as described above may be utilized for green. Where the layout shown in FIGS. 3A and 3B is in use, the luminance data acquisition part 32 acquires the two-dimensional data about each component, obtaining the luminance of the polarization components of the same color in four directions at positions close to each other. The color image generation part 36 may thus average the luminance values to directly obtain an unpolarized luminance value for each color, before subjecting the unpolarized luminance value to demosaicing so as to generate an unpolarized color image. In this case, the generated color image has its resolution reduced by three-fourths.

The distance information generation part 40 uses generated color images to generate the information about the distance from the imaging plane to the subject. With the present embodiment, the distance to the subject is acquired using the amount of blurring being varied depending on the distance to the subject in the depth direction from an in-focus position. The amount of blurring in this context means a maximum amount of displacement of the actual image relative to the position where the image is supposed to be formed. The amount of blurring may also be considered to be a range in which the pixels making up the image are distributed.

As described above, the light transmitted by the component isolation filter 16 varies in components depending on the region that has transmitted the light. Based on the direction in which the different components appear as a blur in the subject image, the distance information generation part 40 determines a positional relation between the in-focus position and the subject. The distance information generation part 40 outputs the distance information typically in the form of a depth image with its pixel values representing the acquired distance. Details of this topic will be discussed later.

The normal line information generation part 38 acquires polarization properties for each pixel using the polarized color image generated by the polarized color image generation part 34, thereby generating the information representative of the normal lines of the subject. As mentioned above, the luminance values of the polarization components of each color in four directions have been obtained so far for each pixel. Thus the normal line information generation part 38 acquires normal line information using the polarized image of green, for example. Specifically, based on the directional dependence of the polarization components, the normal line information generation part 38 calculates the zenith angles and phase angles of the normal lines over the subject surface or a normal vector of three elements, and outputs the result of the calculation typically in the form of a normal line image representing the result in pixel values. Details of this topic will be discussed later.

When the layout shown in FIGS. 3A and 3B is used, the luminance data acquisition part 32 acquires the two-dimensional data about each component, obtaining the luminance of the polarization components of the same color in four directions at positions close to each other. The normal line information generation part 38 may then use the obtained results to directly evaluate the directional dependence of the polarization components and thereby acquire normal line information. Although the color of light to be evaluated in this case differs depending on the position, the effects on the polarization properties and also on the normal line information obtained therefrom are presumably small. It is to be noted that in this case the generated normal line image has its resolution reduced by three-fourths.

The distance information generation part 40 may generate more detailed distance information using the normal line information generated by the normal line information generation part 38. Where the blurring of images is used as a way of acquiring the distance to the subject, it is easy to obtain the contour of the subject with accuracy above a certain level, but it is difficult to determine the detailed irregularities of the subject surface and the curved surface shape of the subject. In such a case, the distance to the accurately obtained contour is used as the starting point.

Given the starting point, the gradient of the subject surface is obtained from the normal line information. The distance information about each pixel is then determined successively in keeping with the subject surface gradient thus obtained. This permits generation of a depth image representing the detailed irregularities.

The present embodiment generates the normal line image in the same field of view as that of the depth image generated on the basis of image blurring and by use of the luminance value distribution acquired by a single imaging element array 20. That means the normal line image coincides perfectly in position with the depth image. This makes it possible to implement easily and precisely the process whereby a provisionally generated depth image is integrated with the normal line information to generate a detailed depth image. The distance information generation part 40 and the normal line information generation part 38 store the data of the generated distance information (depth image) and normal line information (normal line image) successively into the image data storage part 42.

The data of the polarized color image generated by the polarized color image generation part 34 and the data of the color image generated by the color image generation part 36 may also be stored as appropriate into the image data storage part 42. The data stored in the image data storage part 42 is sent as appropriate to an information processing device such as a game machine that has established communication with the imaging device 12. Alternatively, instead of being stored into the image data storage part 42, the image data may be streamed to the information processing device in the sequence of the pixels of which the data was generated.

The target image to be sent may be the polarized color image, the color image, the normal line image, or the depth image. In the example shown in FIG. 4, the imaging device 12 generates the normal line information and distance information. Alternatively, at least some functions of the normal line information generation part 38 and the distance information generation part 40 may be incorporated in the information processing device so that the information processing device may generate the normal line information and distance information in similar procedures.

FIGS. 5A, 5B, and 5C are schematic views explanatory of the principle of acquiring distance information using the component isolation filter 16 by getting light to pass along different paths in different components. The drawings show the paths, viewed from above the imaging space, along which the light from a subject 130 passes through a focusing lens 132 and the component isolation filter 16 in the imaging optics 14 before being incident on an imaging plane 134 of the imaging element array 20. In each of the states in FIGS. 5A, 5B, and 5C, the distance from the imaging plane 134 to the subject 130 is different. The subject 130 in the state of FIG. 5B is assumed to be imaged at an in-focus position, i.e., on an in-focus plane 138.

That is, in the state of FIG. 5B, the light coming from a point on the subject 130 is imaged at one point on the imaging plane 134 as illustrated. Thus an image 136b representing a single light point is obtained as shown to the right in FIG. 5B. When the subject 130 is imaged past the in-focus plane 138 as in FIG. 5A or imaged short of the in-focus plane 138 as in FIG. 5C, the in-focus position of the imaged point deviates from the imaging plane 134. As a result, blurred images 136a and 136c are obtained. Obviously, the farther the imaged subject 130 deviates from the in-focus plane 138, the larger the amount of blurring.

The component isolation filter 16 has multiple regions transmitting different components of light, the regions being distinguished in the drawings by densely and sparsely hatched portions. Also in the drawings, the component isolation filter 16 is bisected in a vertical direction passing through the optical axis to form a right region and a left region (shown as upper and lower regions in the drawings). However, this arrangement is not limitative of the present disclosure. The light components transmitted in this manner by the component isolation filter 16 form a blurred image on the imaging plane 134 in the direction corresponding to the position of the subject 130.

Specifically, when the subject 130 is imaged past the in-focus plane 138 as in the state of FIG. 5A, the positional relation between the light components is reversed halfway to the imaging plane 134. Thus the detected image 136a reveals the components in a positional relation reverse to that past the component isolation filter 16. In the images 136a and 136c in the drawings, images of the light components transmitted by the different regions are shown using the same densely and sparsely hatched portions as those distinguishing the regions of the component isolation filter 16.

When the subject 130 is imaged short of the in-focus plane 138 as in the state of FIG. 5C, the light components transmitted by the component isolation filter 16 reach the imaging plane 134 in a manner maintaining the positional relation therebetween. Thus the detected image 136c reveals the components in the same positional relation as that past the component isolation filter 16. Given these phenomena, the amount of blurring (e.g., width d in the image 136a) in the detected image is used to determine the distance from the in-focus plane 138 to the subject 130. The direction in which each of the light components appears blurred is then used to determine the positional relation of the subject 130 with regard to the in-focus plane 138.

Figure 6A:
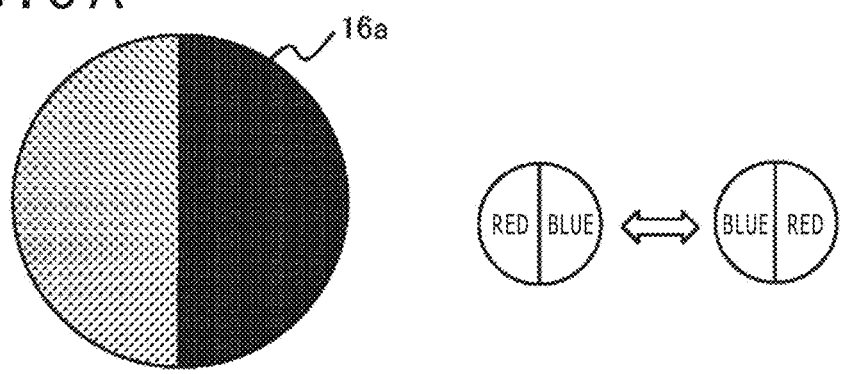
FIGS. 6A and 6B are schematic views showing typical structures of component isolation filters of the embodiment.
Figure 6B:
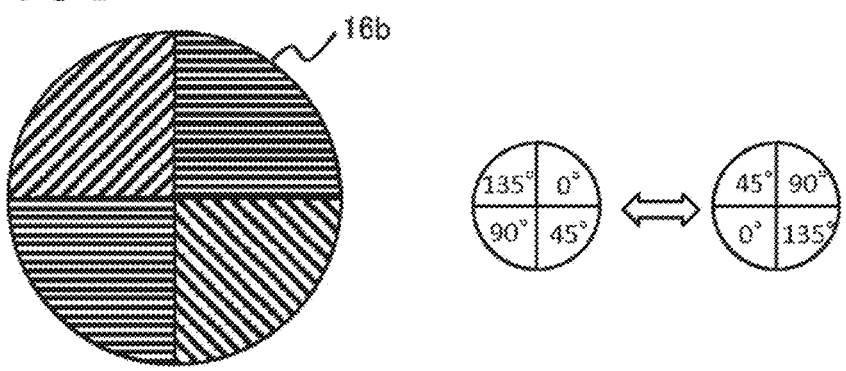

FIGS. 6A and 6B schematically show typical structures of the component isolation filter 16. As described above, the component isolation filter 16 differentiates the components of the light transmitted by its different regions so that an image of the subject appears blurred. The subject image is determined to be short of or past the in-focus plane depending on the direction in which the image is blurred. In this respect, the transmitted light components are not limited to anything specific. In the illustrated example, FIG. 6A shows a filter with multiple regions that transmit different color components, and FIG. 6B indicates a filter with multiple regions that transmit polarization components in different directions.

More specifically, a component isolation filter 16a in FIG. 6A is structured to be divided in two regions along a vertical line passing through the optical axis. The resulting left and right regions have a cyan filter and a yellow filter, respectively. The cyan filter transmits the green and blue components, and the yellow filter transmits the red and green components. By using this component isolation filter 16, the color image generation part 36 generates a color image in which the green component is blurred in all directions while the blue and red components are blurred on the right and on the left, respectively, as shown to the right in FIG. 6A. Depending on whether the subject is imaged past or short of the in-focus plane, the blue and the red images are reversed in positional relation.

A component isolation filter 16b in FIG. 6B is structured to be divided in four regions along a vertical and a horizontal line passing through the optical axis. The resulting top right, bottom right, bottom left, and top left regions are provided with the polarizers transmitting the polarization components at angles of 0, 45, 90, and 135 degrees, respectively. This type of filter may be formed in the same manner as ordinary polarization plates. By using this component isolation filter 16, the polarized color image generation part 34 generates a polarized image of each color in which the different polarization components constitute the blurred images in the top right, the bottom right, the bottom left, and the top left portions, as shown to the right in FIG. 6B. Depending on whether the subject is imaged past or short of the in-focus plane, the polarization components are reversed in positional relation across diagonal lines.

Where the polarizers are used to configure the component isolation filter 16, they may be arranged to let the polarization components be evenly transmitted in four directions as shown in FIG. 6B. This suppresses the effects on the observed polarization properties and also on the normal line information generated by the normal line information generation part 38. The structures of the component isolation filter 16 are not limited to those illustrated. The component isolation filter 16 may be divided along lines other than the vertical or horizontal line, and may be divided in three regions or in five or more regions.

Furthermore, as discussed above, the light component transmitted by each region is not limited to anything specific as long as it can be detected by the imaging element array 20. Also, some region of the component isolation filter 16 may be configured to transmit incident light without polarizing it. This permits direct acquisition of the luminance distribution of the light that includes all components. The acquired distribution may be used for display purposes or for the interpolation of other images.

Existing techniques provide processes whereby a subject space is imaged through a filter with its different regions transmitting different colors and whereby the amount of blurring in the imaged space and the direction in which each color is blurred are used to generate a depth image, as disclosed in "Extracting Depth and Matte using a Color-Filtered Aperture" by Yosuke Bando, Bing-Yu Chen, and Tomoyuki Nisita, ACM Trans. Graphics 27(5), 134:1-134:9, 2008. With the present embodiment, the distance information generation part 40 may utilize such existing techniques to generate blurring-based distance information.

For example, if the component isolation filter shown in FIG. 6A is used, the subject images of the red and the blue components are blurred when displaced by an amount of ±d crosswise from a normal image formation position (x, y). It is assumed here that $I_r(x, y)$ and $I_b(x, y)$ represent the luminance values of the red and the blue components respectively at the pixel position (x, y), that $\lambda_0$ and $\lambda_1$ ($\lambda_0 \geq \lambda_1 \geq 0$) stand for eigenvalues in a covariance matrix $\Sigma$, and that $\sigma_r^2$ and $\sigma_b^2$ denote the variances of the components in a color distribution defined as $S_f(x, y; d) = \{I_r(s+d, t), I_b(s-d, t) | (s, t) \in w(x, y)\}$ in a minute window w centering on the pixel of interest. On this assumption, the value d that minimizes $$L(x,y;d) = \lambda_0 \lambda_1 / \sigma_r^2 \sigma_b^2$$

is assumed to be the amount of displacement (amount of blurring). Whether the value d is positive or negative determines the direction in which the red and the blue components are blurred.

Given the color image, the distance information generation part 40 acquires the amount of displacement a for each pixel as described above and, based on the absolute displacement value and on the direction in which each component is blurred, determines the distance from, the imaging plane to the subject so as to generate a depth image. Since the relation between the amount of displacement ±d of each component and the distance to the subject is dependent on the optics in use, geometric calculations may be performed to find the distance with the above data taken into consideration. Alternatively, initial calibration may be performed to prepare a table for obtaining the distance from the amount of displacement ±d, with the resulting table stored into an internal memory. Where the component isolation filter 16*b* shown in FIG. 6B is adopted, the calculations involved are the same except that the distribution is evaluated in four dimensions.

Described below is a method whereby the normal line information generation part 38 generates normal line information. Studies have been conducted on the techniques for acquiring diverse information about the subject using images of polarization components in multiple directions. One method of obtaining a normal vector of the subject surface is disclosed, for example, by Gary Atkinson and Edwin R. Hancock in "Recovery of Surface Orientation from Diffuse Polarization," IEEE Transactions on Image Processing, June 2006, 15 (6), pp. 1653-1664, and in Japanese Patent Laid-Open No. 2009-58533. These techniques may be adopted as needed for the present embodiment. What follows is an outline of the techniques.

The luminance of the light observed via a polarizer varies with respect to the principal axis angle $\theta_{pol}$ of the polarizer, as expressed by the following expression:

$$I = \frac{I_{max} + I_{min}}{2} + \frac{I_{max} - I_{min}}{2}\cos(2(\theta_{pol} - \phi))$$ (Expression 1)

Where, $I_{max}$ and $I_{min}$ represent, respectively, a maximum and a minimum value of the observed luminance, and φ denotes a polarization phase. As described above, if polarized images are obtained for four principal axis angles $\theta_{pol}$, the luminance I of the pixels at the same position satisfies the mathematical expression 1 above with respect to each principal axis angle $\theta_{pol}$. Thus by approximating a curve passing through the coordinates (I, $\theta_{pol}$) with a cosine function using a least square method for example, it is possible to obtain the values $I_{max}$, $I_{min}$, and φ. The values $I_{max}$ and $I_{min}$ thus obtained are used to find a polarization degree ρ with the following mathematical expression:

$$\rho = \frac{I_{max} - I_{min}}{I_{max} + I_{min}}$$ (Expression 2)

A normal line on the subject surface may be expressed using an azimuth angle α indicative of the angle of the incidence plane of light (emission plane in the case of diffuse reflection) and a zenith angle θ indicative of the angle over the surface. According to a dichroic reflection model, the spectrum of reflected light is expressed by the linear sum of specular and diffuse reflection spectrums. Here, specular reflection signifies the light regularly reflected from an object surface, and diffuse reflection denotes the light diffused by pigment particles making up an object. The above-mentioned azimuth angle α represents the principal axis angle that gives the minimum luminance $I_{min}$ with the mathematical expression 1 above in the case of specular reflection, or the principal axis angle that gives the maximum luminance $I_{max}$ with the mathematical expression 1 in the case of diffuse reflection.

The zenith angle θ is in the following relations with the polarization degree $\rho_s$ in the case of specular reflection and with the polarization degree $\rho_d$ in the case of diffuse reflection:

$$\rho_s = \frac{2\sin^2\theta\cos\theta\sqrt{n^2-\sin^2\theta}}{n^2-\sin^2\theta-n^2\sin^2\theta+2\sin^4\theta}$$ (Expression 3)

$$\rho_d = \frac{(n-1/n)^2\sin^2\theta}{2+2n^2-(n+1/n)^2\sin^2\theta+4\cos\theta\sqrt{n^2-\sin^2\theta}}$$

Where, n stands for the refractive index of the subject. The zenith angle θ is obtained by substituting the polarization degree p acquired with the mathematical expression 2 for either $\rho_s$ or $\rho_d$ in the mathematical expression 3. A normal vector ($p_x$, $p_y$, $p_z$) is obtained with the following mathematical expression using the azimuth angle α and the zenith angle θ acquired as described above:

$$\begin{pmatrix} p_x \\ p_y \\ p_z \end{pmatrix} = \begin{pmatrix} \cos\alpha\cos\theta \\ \sin\alpha\cos\theta \\ \sin\theta \end{pmatrix}$$ (Expression 4)

In the manner described above, the normal vector of the subject imaged by each pixel of a polarized image is obtained from the relation between the luminance I of the pixel of interest and the principal axis angle $\theta_{pol}$ of the polarizer. This provides a normal vector distribution of the entire image. An embodiment such as a game machine controller of which the subject is limited may acquire the normal line with higher accuracy by adopting the suitable model of either specular reflection or diffuse reflection on the basis of the color and the material of the embodiment. Meanwhile, diverse techniques for separating specular reflection from diffuse reflection have been proposed. These techniques may also be used to obtain the normal line with precision.

Figure 7:
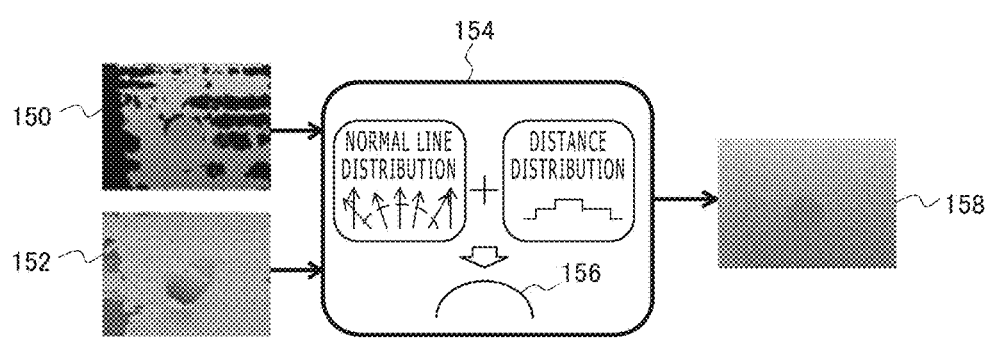
FIG. 7 is a schematic view explanatory of a process in which a distance information generation part of the embodiment generates a detailed depth image.

FIG. 7 is a schematic view explanatory of a process in which the distance information generation part 40 generates a detailed depth image using the depth image and the normal line image obtained from the blurring of images. The distance information generation part 40 first generates a first-stage depth image 150 based on the amount of blurring in the image and on the direction in which each component is blurred as discussed above. According to the above-described techniques, blurring is acquired through correlation between the luminance distributions of the components. With regard to the pixel values in an inner region of the image where color changes are not conspicuous, it is difficult to determine whether the component of interest stems from a blur or is part of a normally formed image. Hence the degree of accuracy in obtaining the distance becomes low. Conversely, with regard to portions such as the subject contour where color changes are conspicuous, the distance is obtained with a relatively high degree of accuracy. Because the amount of blurring is made to correspond to the absolute value of distance by the optics, the distance represented by the first-stage depth image 150 is also given in absolute value.

The distance information generation part 40 further acquires a normal line image 152 generated by the normal line information generation part 38. Because the normal line information appearing in the normal line image is generated by use of reflection and diffusion of light, the normal line information is not much affected by the color of the subject surface, by the amount of feature points, or by the size of the image. Also, the normal line information can be acquired in detail about each pixel regardless of whether or not the pixel is in the inner region of the image. On the other hand, the normal line information does not include distance information. Thus the distance information generation part 40 applies the normal line distribution to the coarsely obtained first-stage depth image, as shown in a process 154 of FIG. 7, in order to generate a detailed second-stage depth image 158.

Shown schematically in the process 154 of FIG. 7 is the normal line distribution obtained from the normal line image 152 regarding a pixel row traversing an image of a spherical subject, along with the distance distribution acquired from the first-stage depth image 150 regarding the same pixel row. Since the distance distribution is indicated in absolute distance values, a given position in that distribution is taken as the base point. Relative to the base point, planes are connected along the gradient of the subject surface represented by normal lines. This provides a representation of a smooth surface shape 156 using the distribution of absolute distance values. This process is repeated on all pixel rows to generate the detailed second-stage depth image 158.

The example of FIG. 7 is one in which the second-stage depth image is completed using the normal line image. Conversely, the accuracy of the normal line image may be improved using the first-stage depth image. As discussed above, the normal line has its phase angle changed by 90 degrees depending on whether the specular reflection component or the diffuse reflection component is dominant. If the normal line obtained using either of the two models has an error of 90 degrees, then the correlation with the separately generated depth image is obviously absent. This clearly indicates that the applied model is inappropriate. In this manner, the normal line information generation part 38 determines the appropriateness of the model being applied. If either model turns out to be inappropriate, the other model is applied again in generating a definitive normal line image.

At this point, the distance information generation part 40 may generate the second-stage depth image using the definitive normal line image thus generated. Because the present embodiment ensures the positional correspondence between the normal line image and the depth image, highly precise data can be generated efficiently through complementary use of the two models. In addition to the normal line image and the depth image, the polarized image and the color image may also be used in a complementary manner. For example, the color image may be used to detect the subject and to track its contour so that normal line information and distance information may be generated only about the regions of the detected subject. This renders the whole processing more efficient than before. This type of processing may be carried out inside the imaging device 12 or on the side of an information processing device.

According to the above-described embodiment of the present disclosure, the imaging device is configured to include mechanisms in which the light from the subject is isolated by the component isolation filter into path-dependent components that are distinguished from each other and detected while the polarization components in multiple directions are simultaneously detected at the same position. The distance from the imaging device to the subject is determined in accordance with the amount of blurring generated proportionately to the distance of the subject from the in-focus plane and on the basis of the direction in which each component is blurred. The distance information such as the depth image is then generated. Meanwhile, the polarization properties of each pixel are acquired from the polarization components in multiple directions. The acquired polarization properties are used to generate the normal line information about the subject in the form of the normal line image, for example.

The images representative of the distance information and normal line information thus obtained, as well as the color images and polarized images having served as the basis for generating these images, all share the same field of view. That means the pixels are easily related to one another between the images. This makes it easy to determine correlation between the images or to merge them in order to obtain further information. For example, detailed normal line information obtained about each pixel is applied to the depth image generated from the blurring of images. This permits generation of a detailed depth image that precisely represents the surface irregularities and curved surface shape of the subject.

There exist techniques for acquiring the depth image based on the principle of triangulation using a stereo camera. The existing techniques involve obtaining through initial calibration the correction values for the correlation between epipolar lines of the right and the left images and for optical axis deviations. However, the camera may be misaligned due to aging for example, affecting the results of the calculations. In such a case, the depth image may become erroneous, and there may occur pixel position deviations between the depth image and the separately acquired normal line image. Such defects can also occur where one of the two cameras constituting the stereo camera is a polarization camera. The defects can also be incurred where an ordinary camera and a polarization camera are provided to obtain the color image and the polarized image separately to acquire the correlation therebetween.

According to the above-described embodiment, all these images are generated from the luminance distribution detected by a single imaging element array. For this reason, the possible aging of hardware does not lead to deviations between the images. As a result, without resorting to calibration for position alignment, the depth image, the normal line image, the polarized image, and the color image may be used in suitable combination to obtain the information about the subject in a stable and accurate manner.

It is to be understood by those skilled in the art that suitable combinations of constituent elements and processes of the embodiment described above as examples may lead to further variations of the present disclosure and that such variations also fall within the scope of the present disclosure.

For example, the imaging device may be a stereo camera having a right set and a left set of components, each set including the imaging optics 14, the component isolation filter 16, the diaphragm 18, and the imaging element array 20 described above in connection with the embodiment, the two sets being disposed a suitable distance apart. In this case, the image processing section 22 acquires two-dimensional distribution of the luminance data detected by the right and the left sets. The distance information generation part 40 then performs stereo matching using the right and left color images or luminance images derived from the acquired data in the same manner as with the existing techniques, thereby generating the depth image. On the other hand, the depth image is also generated using the techniques discussed above in conjunction with the present embodiment.

The two images normally represent the same data. If there occur deviations in position between the right and left images due to the above-mentioned aging of the stereo camera for example, the deviations translate into a difference between the depth images. Thus the difference between the two depth images may be acquired periodically to determine the timing for carrying out calibration anew for stereo matching. If one of the two cameras constituting the stereo camera is an ordinary camera addressing natural light and the other is a set formed by the imaging optics 14, the component isolation filter 16, the diaphragm 18, and the imaging element array 20 making up the above-described embodiment, the obtained effects are still the same.

The present disclosure contains subject matter related to that disclosed in Japanese Priority Patent Application JP 2016-177965 filed in the Japan Patent Office on Sep. 12, 2016, the entire content of which is hereby incorporated by reference.

What is claimed is:

1. An imaging device comprising:
a filter configured to have a plurality of regions transmitting different light components;
imaging elements configured to detect a luminance distribution of polarization components in a plurality of directions among the different light components transmitted by the filter; and
an image processing section configured to analyze the detected luminance distribution based on correlation between the polarization components, thereby generating a plurality of items of information about a subject, wherein the image processing section includes:
a normal line information generation part configured to generate information about a normal line on a surface of the subject on the basis of changes in luminance of the polarization components in the plurality of directions; and
a distance information generation part configured to generate information about a distance from the imaging device to the subject on the basis of a distribution of images formed by the different light components transmitted by the filter,
wherein the normal line information generation part determines whether a reflection model used in generating the normal line information is appropriate, by comparing the normal line information with the distance information generated by the distance information generation part on the basis of the image distribution.

2. The imaging device according to claim 1, wherein the distance information generation part generates more detailed distance information by interpolating the distance information generated on the basis of the image distribution, through the use of the normal line information generated by the normal line information generation part.

3. The imaging device according to claim 1, wherein the filter has each of the regions thereof transmitting the polarization component in a different direction.

4. The imaging device according to claim 1, wherein the filter as a whole is divided in four regions each furnished with polarizers having a different principal axis angle.

5. The imaging device according to claim 1, wherein the filter has each of the regions thereof transmitting the light of a different color component.

6. The imaging device according to claim 1, further comprising two imaging parts including the filter and the imaging elements each and configured to acquire the luminance distribution from a right and a left positions at which the imaging parts are disposed a predetermined distance apart;
wherein the distance information generation part acquires the distance information based on a difference between corresponding points in a right and a left luminance images generated from the acquired luminance distribution, the distance information generation part further comparing the acquired distance information with the distance information generated from the image distribution to determine whether calibration may be necessary for obtaining the distance information from the right and the left luminance images.

7. A method, comprising:
transmitting different light components from a filter configured to have a plurality of regions;
detecting a luminance distribution of polarization components in a plurality of directions among the different light components transmitted by the filter; and
analyzing the acquired luminance distribution based on correlation between the polarization components to generate a plurality of items of information about a subject, wherein the analyzing includes:
generating information about a normal line on a surface of the subject on the basis of changes in luminance of the polarization components in the plurality of directions; and
generating information about a distance from the imaging device to the subject on the basis of a distribution of images formed by the different light components transmitted by the filter,
wherein the generating information about a normal line includes determining whether a reflection model used in generating the normal line information is appropriate, by comparing the normal line information with the distance information on the basis of the image distribution.

8. A non-transitory, computer-readable storage medium containing a computer program, which when executed by a computer, causes the computer to carry out actions, comprising:
facilitating transmitting different light components from a filter configured to have a plurality of regions;
detecting a luminance distribution of polarization components in a plurality of directions among the different light components transmitted by the filter; and
analyzing the acquired luminance distribution based on correlation between the polarization components to generate a plurality of items of information about a subject, wherein the analyzing includes:
generating information about a normal line on a surface of the subject on the basis of changes in luminance of the polarization components in the plurality of directions; and
generating information about a distance from the imaging device to the subject on the basis of a distribution of images formed by the different light components transmitted by the filter,
wherein the generating information about a normal line includes determining whether a reflection model used in generating the normal line information is appropriate, by comparing the normal line information with the distance information on the basis of the image distribution.

* * * * *